United States Patent
Hirao et al.

(10) Patent No.: US 10,090,222 B2
(45) Date of Patent: Oct. 2, 2018

(54) SEMICONDUCTOR DEVICE WITH HEAT DISSIPATION AND METHOD OF MAKING SAME

(71) Applicant: Fuji Electric Co., Ltd., Kanagawa (JP)

(72) Inventors: Akira Hirao, Nagano (JP); Eiji Mochizuki, Nagano (JP); Fumihiko Momose, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/863,727

(22) Filed: Jan. 5, 2018

(65) Prior Publication Data
US 2018/0240730 A1   Aug. 23, 2018

(30) Foreign Application Priority Data

Feb. 17, 2017  (JP) .................................. 2017-028079

(51) Int. Cl.
  *H01L 23/367* (2006.01)
  *H01L 23/373* (2006.01)
  *H01L 21/48* (2006.01)
  *H01L 23/053* (2006.01)

(52) U.S. Cl.
  CPC ...... *H01L 23/3733* (2013.01); *H01L 21/4817* (2013.01); *H01L 21/4871* (2013.01); *H01L 23/053* (2013.01); *H01L 23/3672* (2013.01)

(58) Field of Classification Search
  CPC .................... H01L 23/3672; H01L 23/3733
  See application file for complete search history.

(56) References Cited

U.S. PATENT DOCUMENTS

| 5,287,248 A * | 2/1994 | Montesano ............. F28F 21/00 165/185 |
| 5,958,572 A * | 9/1999 | Schmidt .............. H01L 23/3733 174/258 |
| 6,758,263 B2 * | 7/2004 | Krassowski ............ F28F 13/00 165/185 |
| 8,698,131 B2 | 4/2014 | Gyoda |

(Continued)

FOREIGN PATENT DOCUMENTS

| JP | 2010-231979 A | 10/2010 |
| JP | 2012-199335 A | 10/2012 |
| WO | 2016/098890 A1 | 6/2016 |

*Primary Examiner* — Robert Bachner
*Assistant Examiner* — Molly Reida
(74) *Attorney, Agent, or Firm* — Chen Yoshimura LLP

(57) ABSTRACT

A semiconductor device includes: a semiconductor module and a heat dissipation sheet attached to a bottom surface of the semiconductor module, the heat dissipation sheet including: a sheet-shaped first conduction part that has a first main surface bonded to the bottom surface of the circuit substrate, a thermal conductivity of the first conduction part in directions along the first main surface being higher than a thermal conductivity of the first conduction part in a thickness direction; and a sheet-shaped second conduction part that is provided next to the first conduction part at an end of the first conduction part and that has a second main surface continuing from the first main surface, a thermal conductivity of the second conduction part in a thickness direction being higher than a thermal conductivity of the second conduction part in directions along the second main surface.

8 Claims, 9 Drawing Sheets

(56) References Cited

U.S. PATENT DOCUMENTS

| | | | |
|---|---|---|---|
| 2003/0116312 A1* | 6/2003 | Krassowski | F28F 13/00 |
| | | | 165/185 |
| 2012/0236502 A1 | 9/2012 | Yamaguchi et al. | |
| 2014/0287239 A1* | 9/2014 | Scurati | B29C 65/4855 |
| | | | 428/408 |

* cited by examiner

SEMICONDUCTOR DEVICE WITH HEAT DISSIPATION AND METHOD OF MAKING SAME

BACKGROUND OF THE INVENTION

Technical Field

The present invention relates to a semiconductor device and a method of manufacturing a semiconductor device, and particularly relates to a semiconductor device offering heat dissipation characteristics and a method of manufacturing the same.

Background Art

There has been a growing demand in recent years for various types of power semiconductor devices to handle greater amounts of current and to be smaller in size. Technology for improving heat dissipation characteristics is in particular demand. Examples of members used for heat dissipation in power semiconductor devices include thermal compounds, heat dissipation sheets, and the like. There is a known technique in which a graphite sheet is used as a heat dissipation sheet, for example (see Patent Document 1). The invention disclosed in Patent Document 1 integrates the heat dissipation sheet, which is a graphite sheet, with an organic EL panel by adhering the sheet thereto in order to dissipate heat from the organic EL panel. Graphite sheets have also been used as heat dissipation sheets for semiconductor devices (see Patent Document 2). In the invention disclosed in Patent Document 2, a rod-shaped heat transport body such as a heat pipe is fabricated by alternately laminating graphite sheets and adhesive layers on one another to form a graphite sheet laminate of around 4 to 9 layers or more, for example, and then cutting out a plurality of parts from the graphite sheet laminate.

If a thermal compound is used instead of a heat dissipation sheet for the semiconductor device, there is a risk that dry-out or pump-out of the thermal compound could occur during operation of the power semiconductor device, which could lead to degradation in heat dissipation characteristics and thus a loss of reliability for the power semiconductor device. Furthermore, if the technique disclosed in Patent Document 1 were used as-is for a heat dissipation sheet of a semiconductor device, the heat dissipation effects would not necessarily be adequate for a device that generates a comparatively large amount of heat and is required to be small in size, such as power semiconductor devices. Moreover, in the technique disclosed in Patent Document 2, the rod-shaped heat transport body is a laminate that is large in the thickness direction; thus, if applied to a semiconductor device, the entire semiconductor device would increase in size.

RELATED ART DOCUMENTS

Patent Documents

Patent Document 1: Japanese Patent Application Laid-Open Publication No. 2010-231979

Patent Document 2: WO 2016/098890

SUMMARY OF THE INVENTION

The present invention was made in consideration of the aforementioned problems and aims at providing a semiconductor device capable of improving heat dissipation characteristics and also having insignificant degradation of heat dissipation characteristics, and a method of manufacturing the semiconductor device.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor module that includes a circuit substrate and a semiconductor chip disposed on a top surface of the circuit substrate; and a heat dissipation sheet attached to a bottom surface of the circuit substrate of the semiconductor module so as to dissipate heat that is generated by the semiconductor chip, the heat dissipation sheet including: a sheet-shaped first conduction part that has a first main surface bonded to the bottom surface of the circuit substrate, a thermal conductivity of the first conduction part in directions along the first main surface being higher than a thermal conductivity of the first conduction part in a thickness direction of the first conduction part; and a sheet-shaped second conduction part that is provided next to the first conduction part at an end of the first conduction part and that has a second main surface continuing from the first main surface, a thermal conductivity of the second conduction part in a thickness direction of the second conduction part being higher than a thermal conductivity of the second conduction part in directions along the second main surface.

Furthermore, in one aspect, the present disclosure provides a method of manufacturing a semiconductor device, including: preparing a semiconductor module that includes a circuit substrate and a semiconductor chip on a top surface of the circuit substrate; preparing a heat dissipation sheet that includes: a sheet-shaped first conduction part that has a first main surface, a thermal conductivity of the first conduction part in directions along the first main surface being higher than a thermal conductivity of the first conduction part in a thickness direction of the first conduction part; and a sheet-shaped second conduction part that is provided next to the first conduction part at an end of the first conduction part and that has a second main surface continuing from the first main surface, a thermal conductivity of the second conduction part in a thickness direction of the second conduction part being higher than a thermal conductivity of the second conduction part in directions along the second main surface; and bonding the first main surface of the first conductive part to a bottom surface of the circuit substrate of the semiconductor module.

The embodiments of present invention makes it possible to provide a semiconductor device capable of improving heat dissipation characteristics and also having insignificant degradation of heat dissipation characteristics, and a method of manufacturing the semiconductor device.

It is to be understood that both the foregoing general description and the following detailed description are exemplary and explanatory, and are intended to provide further explanation of the invention as claimed.

DETAILED DESCRIPTION OF EMBODIMENTS

Figure 1:
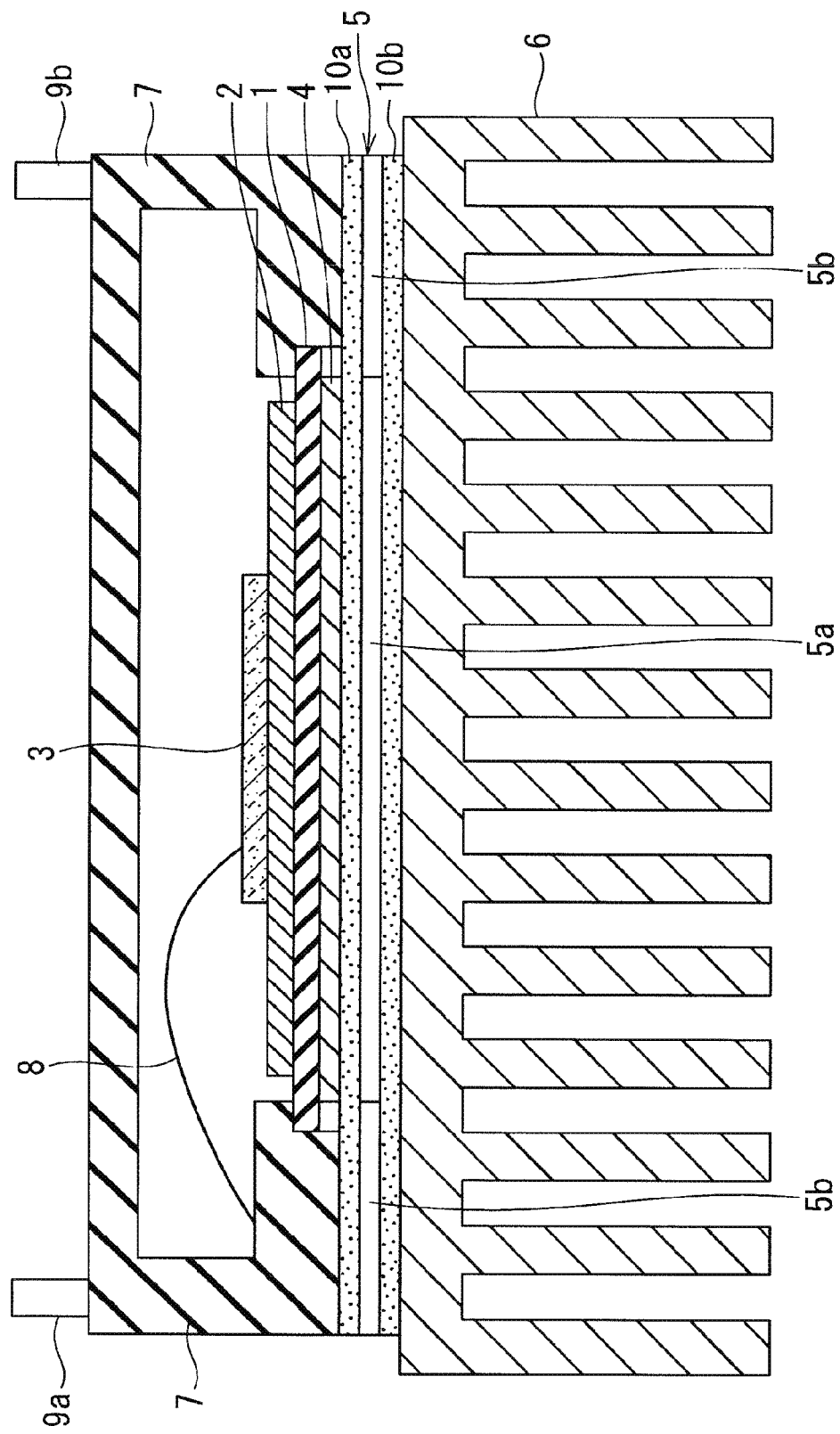
FIG. 1 is a cross-sectional view for schematically describing the outline of a configuration of a semiconductor device according to an embodiment of the present invention.

Embodiments of the present invention will be described below. In the drawings, portions that are the same or similar will be assigned the same or similar reference characters. However, it should be noted that the drawings are schematic, and that the relationships between the thickness and planar dimensions, the proportions of the thicknesses of the respective devices and members, etc. differ in practice. Thus, specific thicknesses and dimensions should be determined with reference to the descriptions below. There are naturally portions that differ in dimensional relations and proportion in their depiction among different drawings.

Furthermore, directions of "left-right," "up-down," etc. in the descriptions below are merely used for convenience and do not limit the technical spirit of the present invention. Thus, if the sheet were rotated 90°, "left-right" and "up-down" would be interchanged, and naturally, if the sheet were rotated 180°, "left" would become "right" and "right" would become "left," for example.

(Structure of Semiconductor Device)

As shown in FIG. 1, a semiconductor device according to an embodiment of the present invention includes a semiconductor module (1, 2, 3, 4), and a case 7 that houses the semiconductor module (1, 2, 3, 4) therein. The semiconductor module (1, 2, 3, 4) has a circuit substrate (1, 2, 4) and a semiconductor chip 3 disposed on the circuit substrate (1, 2, 4).

The circuit substrate (1, 2, 4) of the semiconductor module (1, 2, 3, 4) can be a structure such as a copper bonded substrate having a front surface metal foil 2 and rear surface metal foil 4 such as copper foil on a top and bottom of an insulating substrate 1, respectively. A known representative example of the copper bonded substrate is a direct copper bonded (DCB) substrate or an active metal brazed (AMB) substrate. The insulating substrate 1 can be an alumina oxide ($Al_2O_3$) ceramic, an aluminum nitride (AlN) ceramic, a silicon nitride ($Si_3N_4$) ceramic, or the like, for example. The semiconductor element constituting the semiconductor chip 3 can be an insulating gate bipolar transistor (IGBT) or the like, for example. The laminate structure and arrangement of the semiconductor regions inside the semiconductor chip 3 are omitted in the drawings.

A heat dissipation sheet 5 on which the semiconductor module (1, 2, 3, 4) is placed is further provided on the bottom of the rear surface metal foil 4 of the semiconductor module (1, 2, 3, 4). A cooling device 6 is further disposed below the semiconductor module (1, 2, 3, 4), with the heat dissipation sheet 5 being interposed therebetween.

Figure 2A:
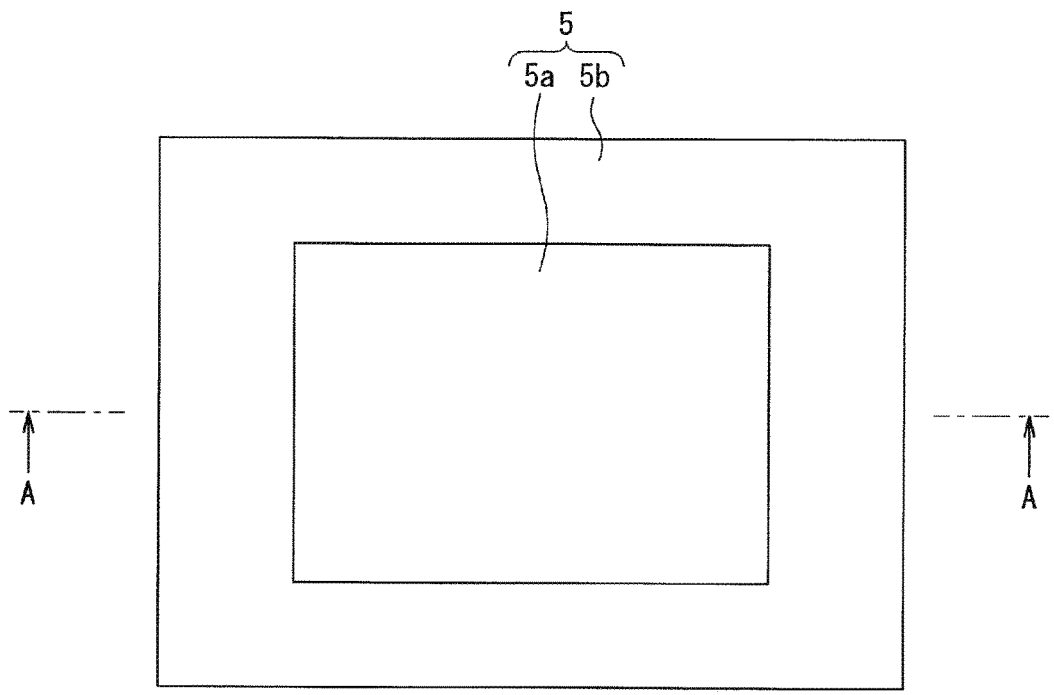
FIG. 2A is a top view of a heat dissipation sheet used in the semiconductor device of the embodiment of the present invention.

As shown in FIG. 2A, the heat dissipation sheet 5 is a generally rectangular shape in a plan view pattern. The heat dissipation sheet 5 includes a sheet-shaped first conduction part 5a having a main surface on top that bonds to the bottom surface of the semiconductor module (1, 2, 3, 4), and a sheet-shaped second conduction part 5b provided next to the first conduction part 5a on the ends of the first conduction part 5a and having a main surface on top that is continuous with the main surface on the top of the first conduction part 5a.

In essence, aside from an adhesive agent 10a and an adhesive agent 10b, there is only the heat dissipation sheet 5 between the rear surface metal foil 4 of the circuit substrate (1, 2, 4) and the cooling device 6, and thus there is no heat dissipation metal base provided. In other words, the semiconductor module (1, 2, 3, 4) in the semiconductor device according to the embodiment of the present invention is a so-called heat dissipation baseless structure in which the semiconductor module is secured directly to the cooling device 6, without a cooling base therebetween, in order to reduce costs and lower thermal resistance. Semiconductor modules having a heat dissipation base sometimes have large warps of approximately 50 μm on the rear surface side thereof, for example. The baseless structure avoids such large warping of the semiconductor module and thus further increases adhesiveness with the heat dissipation sheet 5 and makes it possible to further enhance the heat dissipation characteristics of the semiconductor device. If securing the circuit substrate (1, 2, 4) to the cooling device 6 with screws, a prescribed number of screw holes that go through the circuit substrate (1, 2, 4) may be provided.

The case 7 can be made of an insulating material such as resin and can be a cuboid-shaped box that partially opens at the bottom thereof, for example. The bottom surface of the case 7 of the semiconductor device according to the embodiment of the present invention is provided on the second conduction part 5b of the heat dissipation sheet 5. Thus, the side walls of the case 7 rise upward from the outer edges of the second conduction part 5b. As shown in FIG. 1, the semiconductor module (1, 2, 3, 4) is disposed at the opening in the bottom surface of the case 7 toward the inside of the case and is housed within the case 7. The semiconductor module (1, 2, 3, 4) is disposed so as to form a portion of the bottom of the case 7 with the bottom surface of the rear surface metal foil 4 of the semiconductor module (1, 2, 3, 4) being made to have the same horizontal plane as the bottom surface of the case 7.

As illustratively shown by the two external connection terminals 9a, 9b provided on both left-right ends at the top of the case 7 in FIG. 1, metal connection terminals or the like that electrically connect to the semiconductor chip 3 are provided on the top wall or side walls of the case 7. Connection members such as connection terminals other than the external connection terminals 9a, 9b are omitted from the drawings.

Furthermore, FIG. 1 illustratively shows a state in which the semiconductor chip 3 is connected to the case 7 by a bonding wire 8. In addition to the bonding wire 8, other connection members such as other bonding wires or a lead frame that electrically connect to the semiconductor chip 3 can be placed inside the case 7.

Heat generated from the semiconductor chip 3 due to conduction operations of the semiconductor chip 3 flows to the cooling device 6, and the cooling device 6 thus reduces the amount of heat accumulating inside the semiconductor module (1, 2, 3, 4). As shown in FIG. 1, the cooling device 6 can be a cooling fin or the like in which a plurality of protruded structures are provided in order to widen the heat transfer area and increase the efficiency of heat exchange. In addition, a heat sink or the like that aims to dissipate or absorb heat could also be used.

The first conduction part 5a and the second conduction part 5b integrally form the heat dissipation sheet 5. The main surface on the top side of the first conduction part 5a corresponds to the "first main surface" in the embodiments of the present invention, and the main surface on the top side of the second conduction part 5b corresponds to the "second main surface" in the embodiments of the present invention.

The first conduction part 5a is a generally rectangular shaped region disposed in the center of the heat dissipation sheet 5. The rectangular shape of the main surface of the first conduction part 5a is generally equal to the shape of the bottom surface of the semiconductor module (1, 2, 3, 4), i.e., the rear surface metal foil 4. Thus, the heat from the bottom surface of the rear surface metal foil 4 can be received by the entire main surface of the first conduction part 5a.

The second conduction part 5b is a frame-shaped region disposed on the periphery of the first conduction part 5a so as to surround the first conduction part 5a. The second conduction part 5b is provided continuously around all four sides of the rectangular shape of the first conduction part 5a; therefore, the whole heat from the first conduction part 5a can be evenly and equally dispersed in four directions and received by the second conduction part.

Figure 2B:
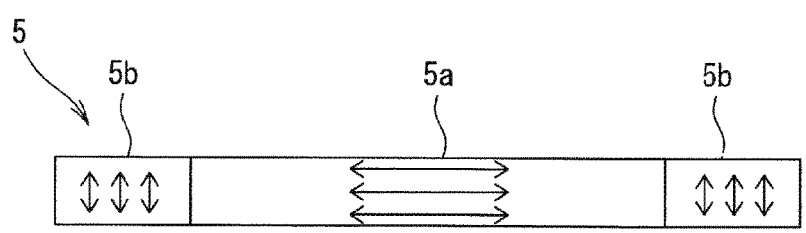
FIG. 2B is a cross-sectional view seen from the direction of the A-A line in FIG. 2A.

The first conduction part 5a is made of a first anisotropic material in which thermal conductivity in the horizontal directions, which are directions along the first main surface, differs from thermal conductivity in the vertical direction along the thickness direction. The first anisotropic material is anisotropic in that the thermal conductivity in the direction along the first main surface is dominantly higher than that in the thickness direction. In FIG. 2B, the dominance of the thermal conductivity in the first conduction part 5a is illustratively shown by three bidirectional arrows extending in the horizontal direction.

Similar to above, the second conduction part 5b is made of a second anisotropic material in which thermal conductivity in the horizontal directions, which is the direction along the second main surface, differs from thermal conductivity in the vertical direction along the thickness direction. The second anisotropic material is anisotropic in that the thermal conductivity in the thickness direction is dominantly higher than in the direction along the second main surface. In FIG. 2B, the dominance of the thermal conductivity in the second conduction part 5b is illustratively shown by three bidirectional arrows extending in the vertical direction in the respective left and right regions of the second conduction part 5b. For convenience of explanation, hatching inside of the heat dissipation sheet 5 has been omitted.

In the semiconductor device according to the embodiment of the present invention, a graphite sheet can be used as the first and second anisotropic materials, for example. If the thermal conductivity of the graphite sheet is approximately 800 to 1600 W/mK in one direction therein, for example, then the thermal conductivity in another direction intersecting with this one direction at right angles would be approximately 3 to 20 W/mK, for example, thus having greatly differing thermal conductivities between the mutually perpendicular directions. On the other hand, in ordinal isotropic members, thermal conductivity in any direction is generally equal to those in other directions. In the case of a silicon heat dissipation sheet 5, for example, the thermal conductivity would be approximately 1.0 to 4.0 W/mK, for example.

(Adhesive Agent)

As shown in FIG. 1, in the semiconductor device in the embodiment of the present invention, an adhesive agent 10b layer is present between the heat dissipation sheet 5 and cooling device 6, and the heat dissipation sheet 5 and cooling device 6 are bonded together by the adhesive agent 10b layer. It is preferable that the adhesive agent 10b be a thermoplastic resin that softens or solidifies based on the temperature, or be a thermocompression bonding type resin having as a main component a thermosetting resin that solidifies when heated due to a chemical reaction.

The thermoplastic resin can be appropriately selected from known materials such as a vinyl acetate resin-based material, a polyvinyl alcohol-based material, a polyamide-based material, or the like. The thermosetting resin can also be appropriately selected from known materials such as an epoxy resin-based material, a polyimide resin-based material, a urethane resin-based material (polyurethane), an ester resin-based material (polyester), or the like.

The thickness of the adhesive agent 10b layer itself can be kept at approximately several μm, for example. Furthermore, the thickness of the graphite sheet serving as the heat dissipation sheet 5 is approximately 25 to 100 μm. Thus, in the semiconductor device according to the embodiment of the present invention, the heat dissipation sheet 5 and cooling device 6 are bonded together by only the adhesive agent 10b layer, thus making it possible to keep the thickness of the bonding layer between the heat dissipation sheet 5 and cooling device 6 markedly low.

Figure 3:
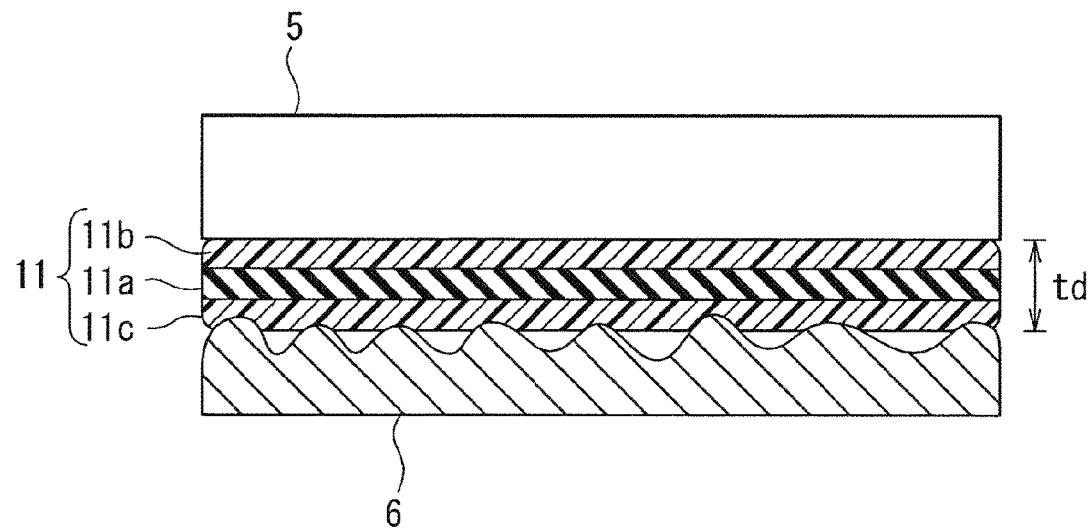
FIG. 3 is a cross-sectional view for schematically describing the bonding state between a heat dissipation sheet of a semiconductor device and a cooling device according to a comparative example.

As illustratively shown by a semiconductor device of a comparative example in FIG. 3, if the heat dissipation sheet 5 and cooling device 6 were to be bonded to each other by double-sided tape 11 with the surfaces thereof opposing each other, the area between the opposing surfaces would be susceptible to gaps due to the surface of the heat dissipation sheet 5 on the cooling device 6 side being formed rough to suppress manufacturing costs. However, if bonding is performed using the adhesive agent 10b, then the adhesive agent 10b can be filled completely into the plurality of gaps formed between the opposing surfaces, which makes it possible to provide a good bonding layer with low thermal resistance and high bonding strength. In other words, it is possible to enhance adhesiveness by suppressing the occurrence of unwanted air layers that would act as thermal insulation between the heat dissipation sheet 5 and the cooling device 6, and to sufficiently extract the performance inherent to the heat dissipation sheet 5. The thermal conductivity between the heat dissipation sheet 5 and cooling device 6 can be approximately 1.5 to 10 W/mK, for example.

On the other hand, the double-sided tape 11, which is an ordinary bonding material, includes a three-layer structure constituted by a centrally positioned insulating base material 11a made of polyethylene terephthalate (PET) or a resin etc., a first adhesive layer 11b disposed on the top surface of the insulating base material 11a, and a second adhesive layer 11c disposed on the bottom surface of the insulating base material 11a.

A thickness td of the double-sided tape 11 is usually approximately 5 μm or greater. Due to this, in the semiconductor device of the comparative example, bonding the heat dissipation sheet 5 and cooling device 6 together with the three-layer double-sided tape 11 would cause the thickness of the bonding layer between the heat dissipation sheet 5 and cooling device 6 to increase to approximately 20 to 60 μm and would also increase thermal resistance. The thermal conductivity between the heat dissipation sheet 5 and cooling device 6 would decrease to approximately 0.2 to 0.4 W/MK, for example, and thus it would be impossible to sufficiently dissipate heat.

Furthermore, as shown in FIG. 3, when bonding with the double-sided tape 11, a plurality of gaps are left between the cooling device 6 and the second adhesive layer 11c, which would create many unwanted air layers that would act as thermal insulation. This would lower adhesiveness and make it impossible to sufficiently extract the performance inherent to the heat dissipation sheet 5, such as a graphite sheet. Moreover, the PET, aluminum foil, etc. of the insulating base material 11a of the double-sided tape 11 also functions as thermal insulation, thus increasing thermal resistance and making it impossible for the heat dissipation sheet 5 to sufficiently exhibit the performance inherent therein.

In the semiconductor device according to the embodiment of the present invention, it is preferable that the adhesive agent 10b have a glass-transition temperature that is higher than the junction temperature of the semiconductor chip. There is no particular limitation on the upper limit of such a glass-transition temperature for the adhesive agent 10b, but it is preferably a glass-transition temperature of 250° C. or below, for example. When using silicon for the semiconductor chip, for example, it is preferable that the adhesive agent 10b have a glass-transition temperature of 180° C. or greater when considering that the heat generated by the semiconductor chip 3 will be transmitted from the semiconductor chip 3 to the adhesive agent 10b through the circuit substrate (1, 2, 4) and heat dissipation sheet 5 in a state in which the heat has accumulated in the adhesive agent 10b.

(Heat Transfer)

Figure 4:
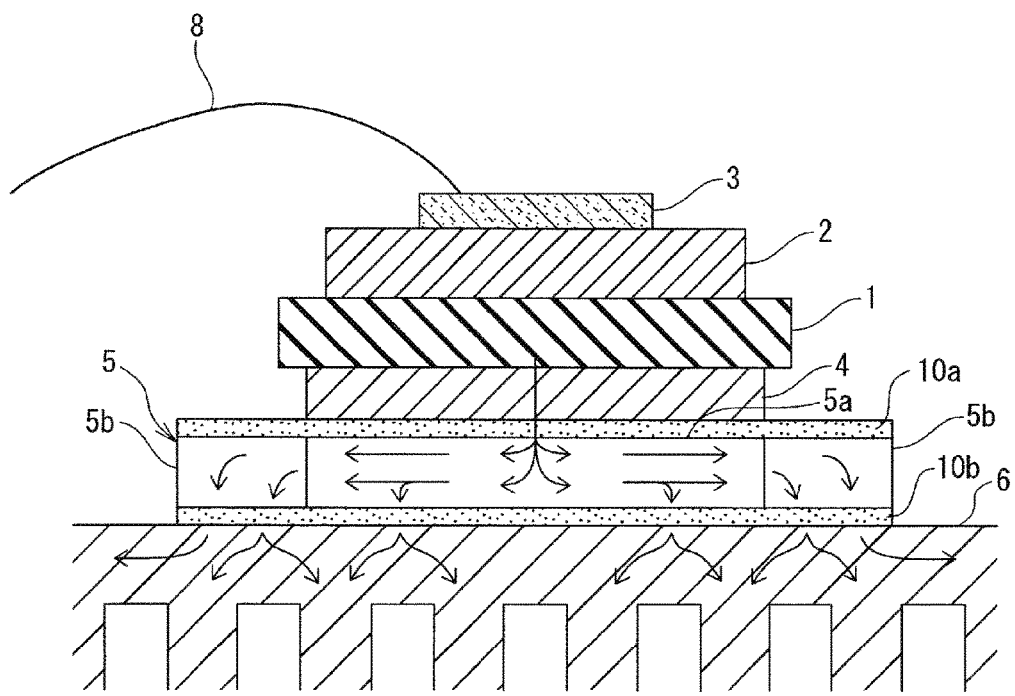
FIG. 4 is a cross-sectional view for schematically describing heat transfer in the semiconductor device according to the embodiment of the present invention.

Next, the heat transfer state inside the semiconductor device shown in FIGS. 1, 2A and 2B will be described in detail. As shown in FIG. 4, the heat generated from the semiconductor chip 3 is first transmitted from the rear surface metal foil 4 of the circuit substrate (1, 2, 4) to the first conduction part 5a.

Next, the heat transfer is promoted such that, inside the first conduction part 5a having high thermal conductivity in the horizontal direction, the heat diffuses along the first main surface toward the outside up until the ends of the first conduction part 5a. The second conduction part 5b is bonded to the ends of the first conduction part 5a; thus, the heat does not accumulate excessively at the ends of the first conduction part 5a but instead passes through the end surfaces between the first conduction part 5a and second conduction part 5b and quickly transfers into the second conduction part 5b. In other words, in a plan view pattern, the heat is diffused from the center region of the heat diffusion sheet 5 toward the outer peripheral region.

Due to the reduction in the accumulation of heat at the ends of the first conduction part 5a, inside the first conduction part 5a it is possible to effectively diffuse, in the horizontal directions, the continuous flow of heat being constantly transmitted from the semiconductor module (1, 2, 3, 4) side located directly above the first conduction part 5a. Meanwhile, inside the second conduction part 5b, the thermal conductivity in the thickness direction is dominant, which promotes transfer along the thickness direction of the second conduction part 5b of the heat that has been transferred from the first conduction part 5a to the second conduction part 5b. The heat is quickly sent to the cooling device 6 below the second conduction part 5b, and therefore excessive heat does not accumulate inside the second conduction part 5b either. Finally, the heat that has been transferred from the first conduction part 5a and second conduction part 5b to the cooling device 6 along the thickness direction is efficiently dissipated by the cooling device 6.

In this manner, in the inside of the heat dissipation sheet 5 of the semiconductor device in the embodiment of the present invention, there is an approximately 90° C. change in the directionality of the transfer of heat generated by the semiconductor chip 3 in the second conduction part 5b forming the peripheral region. In addition, the heat per unit of time sent into the cooling device 6 from the peripheral region of the heat dissipation sheet 5 can be vastly increased.

Figure 5:
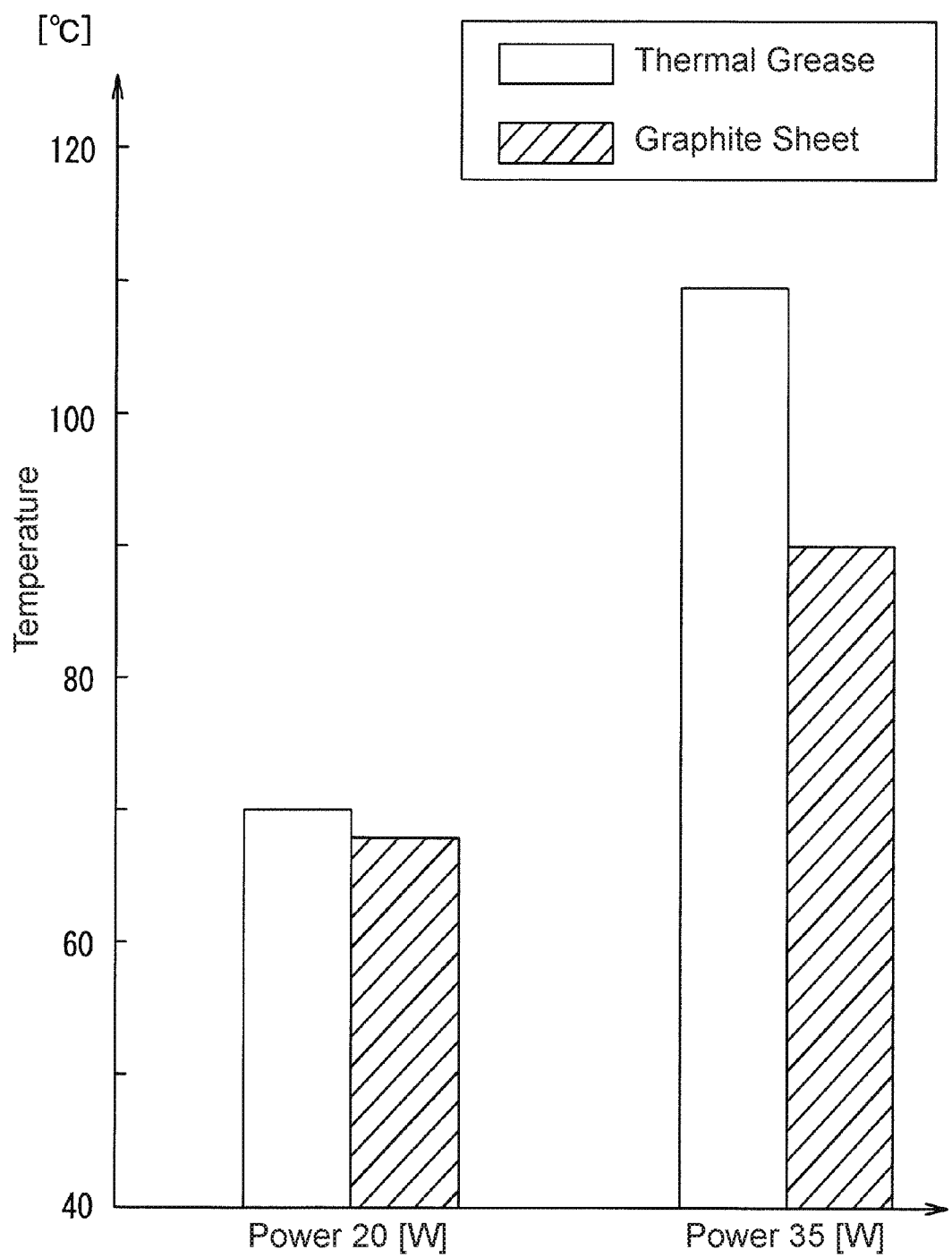
FIG. 5 is a graph diagram showing results from measuring temperatures at the respective top surfaces of semiconductor chips in a semiconductor device that uses a heat dissipation sheet according to the embodiment of the present invention and a semiconductor device that does not use a heat dissipation sheet.

FIG. 5 shows results from measuring the temperatures of the top surfaces of semiconductor chips 3 while the respective semiconductor devices are operated by a constant applied power for a case in which a graphite sheet is attached to the bottom surface of a semiconductor module (1, 2, 3, 4) as the heat dissipation sheet 5 and a case in which thermal grease is coated onto the bottom surface as a conventional thermal compound without using the heat dissipation sheet 5.

It can be seen that when the applied power is 20 W, the semiconductor device using the graphite sheet of the embodiment of the present invention has a lower temperature than that of the semiconductor device with the coated thermal grease. When the output is 35 W, it can be seen that the semiconductor device of the embodiment of the present invention has a much lower temperature than that of the conventional semiconductor device with the coated thermal grease.

In the semiconductor device according to the embodiment of the present invention, the semiconductor module (1, 2, 3, 4) is bonded to the cooling device 6 through the thermal dissipation sheet 5, which has in the center thereof the first conduction part 5a whose thermal conductivity in the horizontal directions is dominant, and the second conduction part 5b, in the peripheral region, whose thermal conductivity in the vertical direction is dominant. This configuration makes it possible to markedly improve the heat dissipation characteristics of the semiconductor device as compared to conventional configurations.

Further, in the semiconductor device according to the embodiment of the present invention, a bonding layer including a thermocompression type adhesive agent 10a is disposed between the semiconductor module (1, 2, 3, 4) and the heat dissipation sheet 5, and a bonding layer including a thermocompression type adhesive agent 10b is disposed between the heat dissipation sheet 5 and the cooling device 6. Thus, the thickness of the bonding layer can be kept thinner than if conventional double-sided tape were to be used. By using the thermocompression type adhesive agent 10b, there will be no unwanted parts such as PET in the bonding layer, and gaps in the bonding interface will be reduced, thus making it possible to enhance thermal conductivity (or, in other words, to lower thermal resistance).

(Method of Manufacturing Semiconductor Device)

Figure 6:
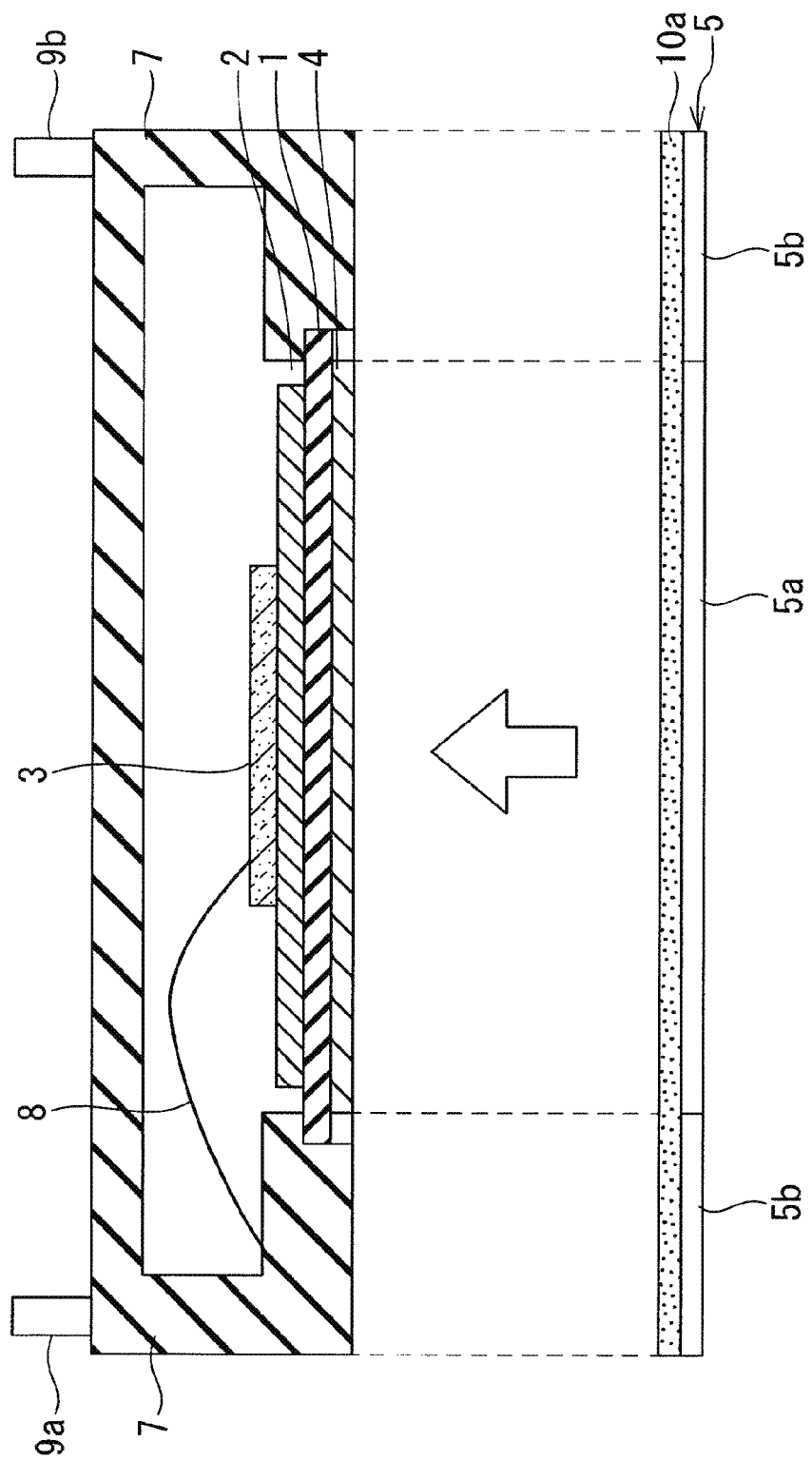
FIG. 6 is a cross-sectional view of a first example of a step showing a method of manufacturing the semiconductor device according to the embodiment of the present invention.

A method of manufacturing the semiconductor device according to an embodiment of the present invention shown in FIGS. 1, 2A, 2B, and 4 will be illustratively described with reference to FIGS. 6 and 7. First, the circuit substrate (1, 2, 4) is prepared, on which a solder plating treatment and the like has been performed on a prescribed region on the surface thereof by printing technology etc. Then, as shown in FIG. 6, the semiconductor chip 3 or another prescribed component is mounted on the circuit substrate (1, 2, 4), thus fabricating the semiconductor module (1, 2, 3, 4).

Next, the semiconductor module (1, 2, 3, 4) is integrated with the case 7 by attaching the module to the lower part inside the case 7. Thereafter, the surface of an electrode such as an output electrode or gate electrode of the semiconductor chip 3 is linked to a prescribed connection terminal disposed on the case 7. A linking member such as the bonding wire 8 or a lead frame can be used for the linking. When using a lead frame or the like, the appropriate processes are performed, such as the solder plating treatment on the surface of the electrode or the like via printing technology etc., soldering using nitrogen gas etc., a prescribed cleaning treatment, or the like. A protective filling agent such as a silicon gel or an epoxy resin is poured into the case 7 and then hardened to a prescribed hardness in order to seal the semiconductor module (1, 2, 3, 4) inside the case 7.

Then, the dissipation sheet 5 is prepared, the sheet being constituted by the generally rectangular first conduction part 5a having the first main surface on the top side of the sheet, and the second conduction part 5b that is a frame-shaped region disposed so as to surround the first conduction part 5a and that has a second main surface on the top side of the sheet. As shown in FIG. 6, the thermocompression type adhesive agent 10a is coated onto the top surface of the heat dissipation sheet 5 by printing technology or the like. Moreover, as shown in FIG. 7, the heat dissipation sheet 5 is attached to the bottom part of the case 7, which is the heat dissipation side of the semiconductor module (1, 2, 3, 4). During attachment, the sheet is held at a pressure of approximately 0.5 N to approximately 5 N in a state in which the adhesive agent 10a has been heated to a temperature of no less than approximately 40° C. to no higher than approximately 200° C.

The holding time changes depending on the heating temperature and the magnitude of the pressure during holding. The parameters further change depending on the shape and size of the semiconductor device containing the cooling device. As an example, if the heating temperature were approximately 40° C. and the pressure were approximately 0.5 N, the holding time would be approximately 10 minutes. If the heating temperature were approximately 200° C. and the pressure were approximately 5 N, the holding time would be approximately 0.5 minutes. If the heating temperature is below 40° C., sufficient compressed bonding cannot be achieved. If the temperature exceeds 200° C., the effect on the semiconductor device will become greater, and thus it is preferable that the heating temperature be approximately 200° C. or below.

Figure 7:
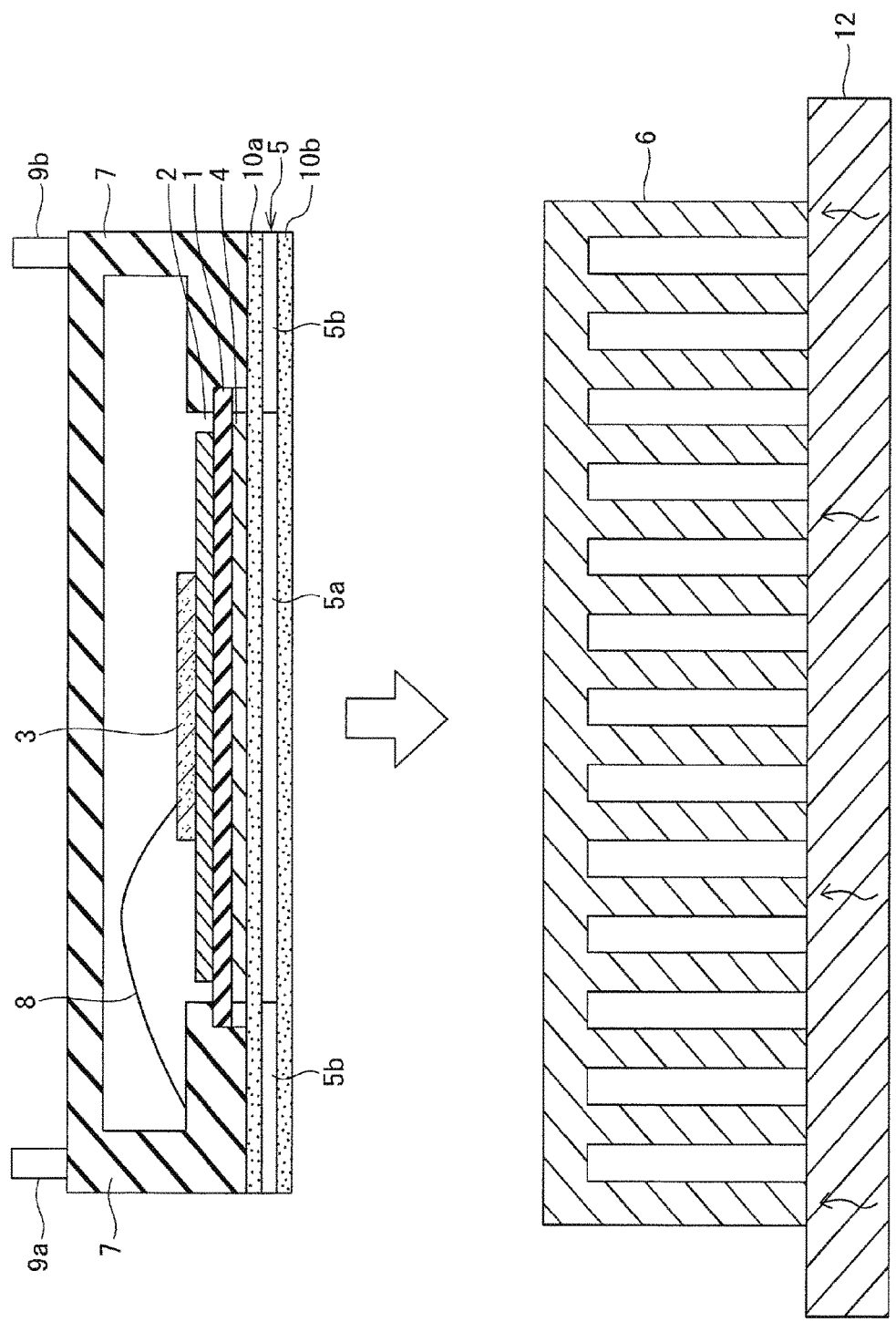
FIG. 7 is a cross-sectional view of a second example of a step showing a method of manufacturing the semiconductor device according to the embodiment of the present invention.

Next, as shown in FIG. 7, the thermocompression type adhesive agent 10b is coated onto the bottom surface of the heat dissipation sheet 5 by printing technology or the like, and the heat dissipation sheet 5 is then attached to the top surface of the cooling device 6. The semiconductor module (1, 2, 3, 4) and cooling device 6 are joined together by screws or the like, for example. At such time, the cooling device 6 is joined to the semiconductor module (1, 2, 3, 4) while heating the cooling device 6 to approximately 30° C. or greater, thereby heating the adhesive agent 10b. The adhesive agent 10b then spreads out between the opposing surfaces of the semiconductor module (1, 2, 3, 4) and the cooling device 6 and fills the gaps between the opposing surfaces. Thereafter, the semiconductor module (1, 2, 3, 4) integrated with the cooling device 6 is removed from a heating apparatus 12, resulting in the semiconductor device of the embodiment of the present invention.

(Modification Example of Method of Manufacturing Semiconductor Device)

Figure 8A:
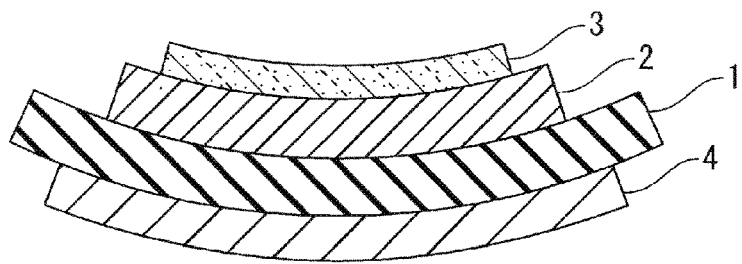
FIG. 8A is a cross-sectional view of a step showing a method of manufacturing the semiconductor device according to a modification example of the embodiment of the present.

Even if the semiconductor module (1, 2, 3, 4) has a baseless structure, the module could warp toward the cooling device 6 side due to internal stress generated in the insulating substrate 1 during fabrication, as shown in FIG. 8A. However, the method of manufacturing the semiconductor device according to the modification example makes it possible to attach the heat dissipation sheet 5 and manufacture the semiconductor device of the embodiment of the present invention, even if the semiconductor module (1, 2, 3, 4) has warped.

Figure 8B:
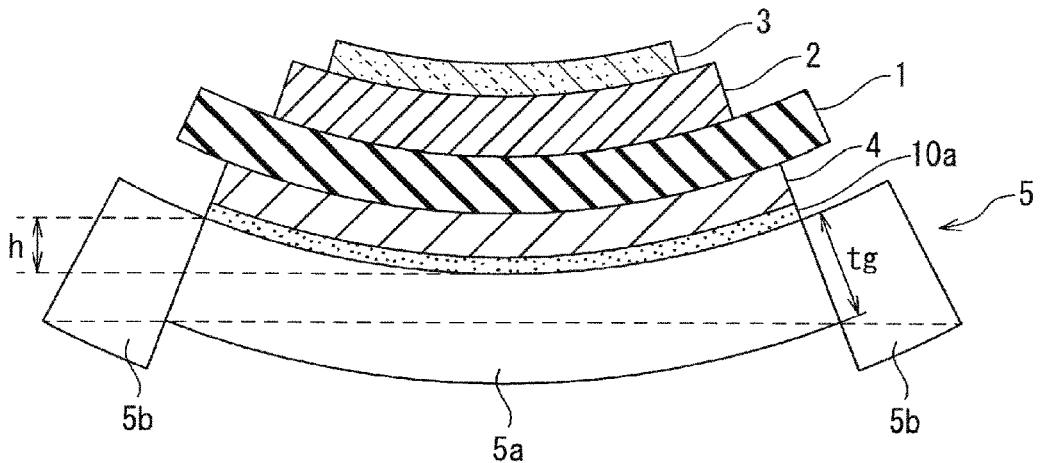
FIG. 8B is a cross-sectional view of a step showing a method of manufacturing the semiconductor device according to a modification example of the embodiment of the present.
Figure 8C:
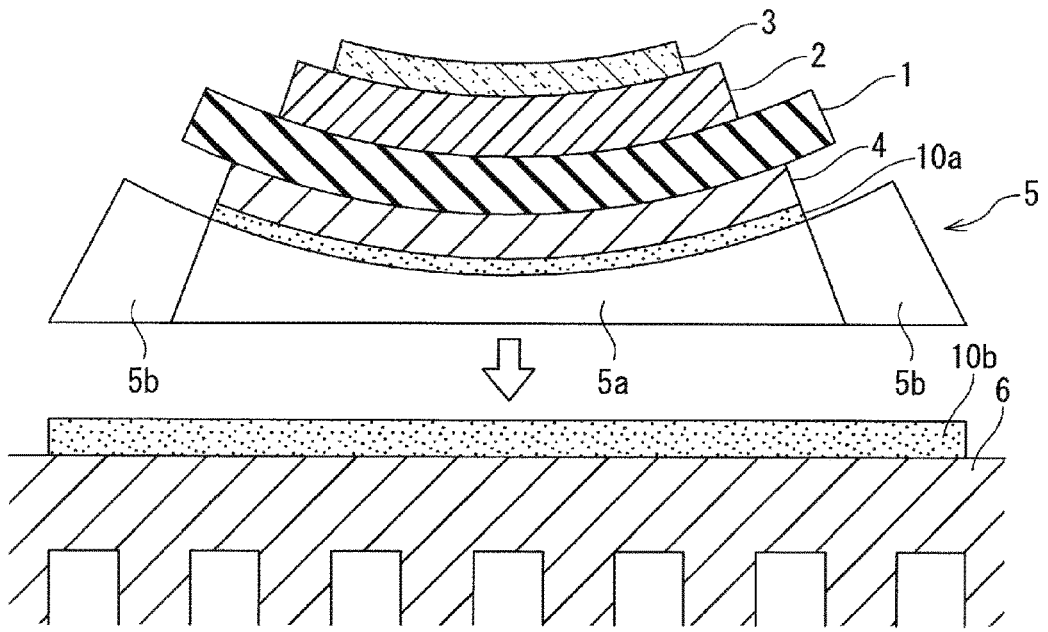
FIG. 8C is a cross-sectional view of a step showing a method of manufacturing the semiconductor device according to a modification example of the embodiment of the present.

First, as shown in FIG. 8B, when the heat dissipation sheet 5 is bonded to the warped semiconductor module (1, 2, 3, 4), the heat dissipation sheet 5 protrudes toward the cooling device 6 in conformance with the warped bottom surface of the semiconductor module (1, 2, 3, 4). Here, in FIG. 8B, as illustratively shown by the lowest horizontal broken line cutting across the heat dissipation sheet 5 through the first conduction part 5a and second conduction part 5b, the rear surface of the heat dissipation sheet 5 positioned on the heat dissipation side is polished and planarized. Then, as shown in FIG. 8C, bonding the planarized rear surface of the heat dissipation sheet 5 and the top surface of the cooling device 6 makes it possible to obtain the semiconductor device in which the bonding strength between the semiconductor module (1, 2, 3, 4) and the cooling device 6 is enhanced.

As illustratively shown in FIG. 8B, it is preferable that the thickness of the second conduction part 5b of the heat dissipation sheet 5 is greater than that of the first conduction part 5a. By setting the second conduction part 5b to be thicker than the first conduction part 5a by a certain amount, it is possible to reliably form the first conduction part 5a at the necessary thickness such that the center portion of the first conduction part 5a can achieve the desired heat dissipation effects, even if the warped bottom surface of the heat dissipation sheet 5 is planarized. A thickness tg of the first conduction part 5a in FIG. 8B is greater than a height difference (warp amount) h between the ends of the rear surface metal foil 4 and the center of the rear surface metal foil 4. In regard to the thickness of the first conduction part 5a in FIG. 8C, the center portion of the first conduction part 5a is thinner than the ends of the first conduction part 5a. It is preferable that the thin center portion of the first conduction part 5a be disposed in the vicinity below the center of the semiconductor chip 3.

In the method of manufacturing the semiconductor device according to the embodiment of the present invention, the semiconductor module (1, 2, 3, 4) is bonded to the cooling device 6 via the thermal dissipation sheet 5, which has in the center thereof the first conduction part 5a whose thermal conductivity in the horizontal directions is dominant, and the second conduction part 5b, in the peripheral region, whose thermal conductivity in the vertical direction is dominant. This configuration makes it possible to markedly improve the heat dissipation characteristics of the semiconductor device as compared to conventional configurations. In the method of manufacturing the semiconductor device according to the modification example, the thickness of the center portion of the first conduction part 5a is less than the thicknesses at the ends of the first conduction part 5a; thus, it is possible to reduce the thermal resistance of the center portion and to improve heat dissipation characteristics. Moreover, the thin center portion of the first conduction part 5a is disposed below the center of the semiconductor chip, and therefore it is possible to reduce the thermal resistance in the vicinity of the center of the semiconductor chip and to further improve heat dissipation characteristics.

Furthermore, in the method of manufacturing the semiconductor device according to the embodiment of the present invention, the cooling device 6 is joined to the semiconductor module (1, 2, 3, 4) while the cooling device is being heated, and thus the adhesive agent 10b is heated and adhesiveness between the semiconductor module (1, 2, 3, 4) and the cooling device 6 is enhanced. This makes it possible to improve the heat dissipation characteristics of the semiconductor device.

(Linking Rod)

Next, a linking rod (13, 15) used in the semiconductor device according to an embodiment of the present invention will be described with reference to FIGS. 9 and 10A to 10C. The linking rod (13, 15) is disposed inside the semiconductor device to electrically connect members together, such as to electrically connect semiconductor modules together or to electrically connect the semiconductor module and case together, in a manner similar to a bus bar, for example. A conventional linking member such as a bus bar generates heat due to the high frequency operations of the semiconductor device.

Figure 9:
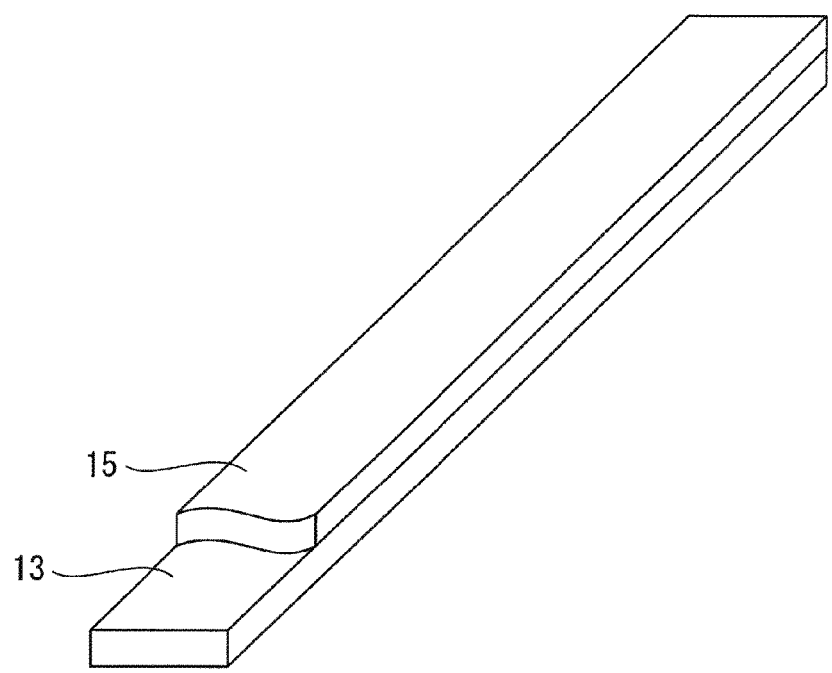
FIG. 9 is a bird's eye view (perspective view) for schematically describing the outline of a configuration for a conductor rod used in a semiconductor device according to another embodiment of the present invention.

As shown in FIG. 9, the linking rod (13, 15) used in the semiconductor device according to the embodiment of the present invention includes a flat-plate shaped linking rod body 13 extending in one direction and a heat dissipation sheet 15 laminated onto the top surface of the linking rod body 13. The linking rod body 13 and heat dissipation sheet 15 may be adhered together by a thermocompression adhesive agent. The linking rod body 13 can be a well-known member such as a bus bar, but the heat dissipation sheet 15 is an anisotropic material, such as a graphite sheet, in which the thermal conductivity greatly differs between mutually perpendicular directions.

Figure 10A:
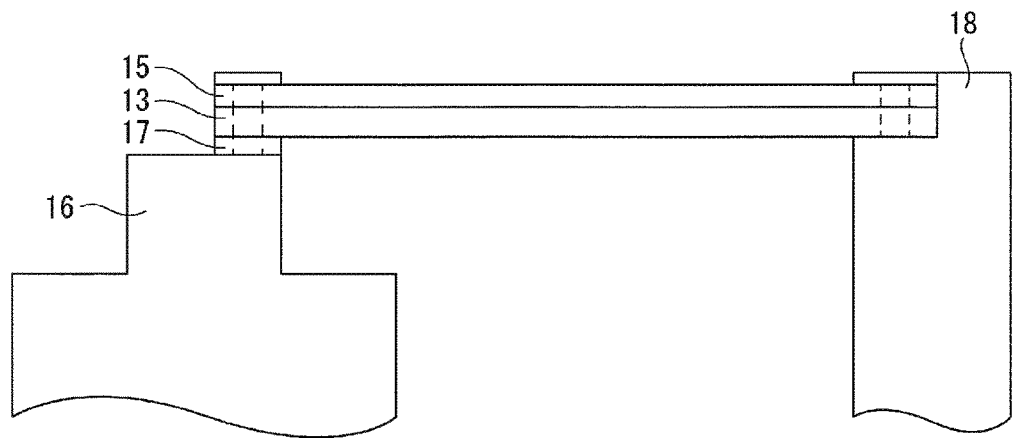
FIG. 10A is a side view for schematically describing a usage state of the conductor rod used by the semiconductor device according to another embodiment of the present invention.

As shown in FIG. 10A, the linking rod (13, 15) can be provided so as to bridge a gap between an external terminal 17 of a semiconductor module 16 and a prescribed connection part on a case 18, for example. The heat dissipation sheet 15 shown in FIG. 10A is a graphite sheet in which the thermal conductivity in the direction parallel to the main surface of the sheet is greater than the thermal conductivity in the thickness direction of the sheet across the entire sheet.

Figure 10B:
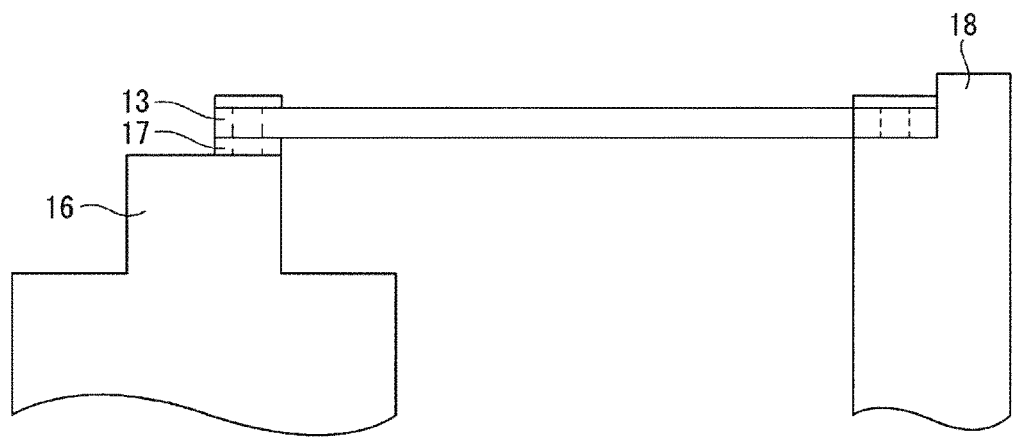
FIG. 10B is a side view for schematically describing a usage state of a conductor rod according to a comparative example.

The linking rod (13, 15) used in the semiconductor device according to the embodiment of the present invention makes it possible to promote uniformity in any rise in temperature between both ends of the linking rod (13, 15) and to suppress unevenness in the distribution of heat. On the other hand, as shown in FIG. 10B, if the heat dissipation sheet 15 were not provided and the linking rod 13 were made of only the linking rod body 13, there would be a marked increase in temperature, particularly in the center region of the rod.

Figure 10C:
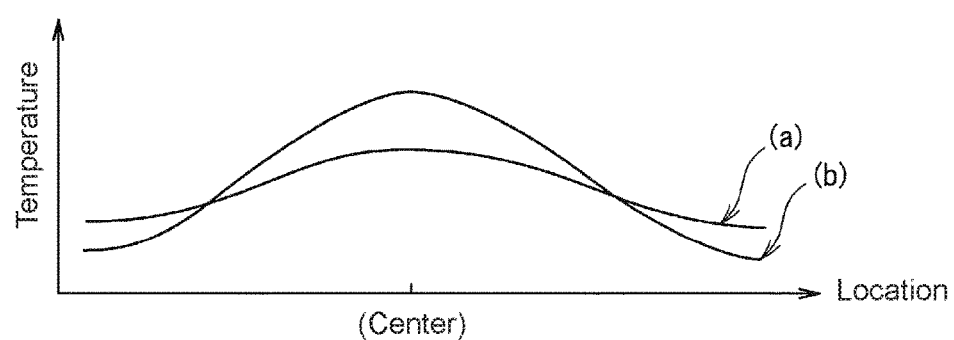
FIG. 10C is a graph diagram for schematically describing respective heat distributions inside the conductor rods of FIG. 10A and FIG. 10B.

FIG. 10C shows a curve (a) representing the temperature distribution between both ends in the linking rod (13, 15) used in the semiconductor device according to the embodiment of the present invention, and a curve (b) representing the temperature distribution in the linking rod 13 made of only the linking rod body 13. In the case of the linking rod (13, 15) used in the semiconductor device according to the embodiment of the present invention, it can be seen that there is more promotion of uniformity in temperature rise between both ends of the rod and more suppression of unevenness in the distribution of heat than in the case of the linking rod 13 made of only the linking rod body 13, and it can be seen that the center region of the rod, in particular, has been suppressed from increasing in temperature.

The use of the linking rod (13, 15) having the heat dissipation sheet 15 shown in FIGS. 9 and 10A in the semiconductor device makes it possible to provide the semiconductor device with greatly enhanced heat dissipation characteristics as compared to if a conventional linking member were used. If the linking rod (13, 15) were disposed on the outside of a semiconductor module sealed by a resin or the like, it would be possible to suppress heat from affecting members disposed around the center of the linking rod (13, 15), which generates large amounts of heat. Furthermore, if the linking rod (13, 15) were disposed inside the semiconductor module, it would be possible to suppress the transmission of high-temperature heat to the filling agent such as a gel or resin in order to prevent air bubbles from forming inside the gel, to prevent the resin from melting, or the like.

Other Embodiments

The present invention was described by the embodiments disclosed above, but the description and drawings constituting the aforementioned part of the disclosure must not be understood as limiting the present invention. Various alternative embodiments, examples, and operational techniques shall be apparent to those having ordinary skill in the art.

For example, in the semiconductor device shown in FIGS. 1, 2A, 2B, and 4, the second conduction part 5b of the heat dissipation sheet 5 was frame-shaped, but the semiconductor device of the present invention is not limited to this frame shape. As another embodiment, the second conduction part 5b of the heat dissipation sheet 5 may be formed by combining together a plurality of rectangular heat dissipation sheet fragments. The second conduction part 5b can be selectively provided in a portion of a region on the ends around the first conduction part 5a in accordance with the specifications of the semiconductor device including the arrangement of the semiconductor chip 3 or the unevenness in the distribution of heat generated during operation. Furthermore, the adhesive agent 10b is preferably a thermocompression type, but it is not limited to the thermocompression type adhesive agent 10b for the semiconductor device of the present invention.

Moreover, the bottom surface of the insulating substrate 1 can be directly bonded to the heat dissipation sheet 5 by the adhesive agent 10a without providing the rear surface metal foil 4. Solder or the like is not used for direct bonding, and thus it would be possible to form the semiconductor module (1, 2, 3) with the insulating substrate 1, surface metal foil 2, and semiconductor chip 3, for example. By not providing the rear surface metal foil 4, it is possible to remove excess members and to reduce the cost of the semiconductor device.

Furthermore, a high-output power semiconductor device, for example, often uses a ceramic-based material for the main component of the insulating substrate. However, if the rear surface metal foil 4 is not provided and instead the insulating substrate 1 is directly bonded to the heat dissipation sheet 5 by the adhesive agent 10a, then the material of the insulating substrate 1 would not be limited to being ceramic-based, thus widening the variety of materials that could be selected.

In addition, if the rear surface metal foil 4 is not provided, it is possible to set the resin component included in the adhesive agent 10a to be the same as the resin component of the insulating substrate 1 in the circuit substrate of the semiconductor module. If the adhesive agent 10a contains an epoxy resin and the insulating substrate 1 contains an epoxy resin, for example, it would be possible to enhance the bonding characteristics of the bonding sections due to the materials being the same and to enhance the strength of the semiconductor device.

The semiconductor device of the present invention can be provided to the customer or the like without needing the cooling device 6. For example, the semiconductor device can be delivered to the customer or the like with the heat dissipation sheet 5 attached to the semiconductor module (1, 2, 3, 4) as shown in FIG. 6, and the customer can fix the heat dissipation sheet 5-attached semiconductor module (1, 2, 3, 4) to whichever cooling device 6 they have prepared on their own, such as to a heat sink. If the semiconductor device is provided with only the heat dissipation sheet 5 attached, it is possible for the customer to select any cooling device, thereby improving convenience for the customer.

In FIGS. 1 to 10C, an IGBT was described as an example of a semiconductor device serving as the semiconductor chip 3, but the present invention is not limited to an IGBT. Various types of semiconductor devices can be used, such as a MOSFET, diode, or the like, as long as the semiconductor device is used in a semiconductor module and generates heat.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor module that includes a circuit substrate and a semiconductor chip disposed on a top surface of the circuit substrate; and
   a heat dissipation sheet attached to a bottom surface of the circuit substrate of the semiconductor module so as to dissipate heat that is generated by the semiconductor chip, the heat dissipation sheet including:
      a sheet-shaped first conduction part that has a first main surface bonded to the bottom surface of the circuit substrate, a thermal conductivity of the first conduction part in directions along the first main surface being higher than a thermal conductivity of the first conduction part in a thickness direction of the first conduction part; and
      a sheet-shaped second conduction part that is provided next to the first conduction part at an end of the first conduction part and that has a second main surface continuing from the first main surface, a thermal conductivity of the second conduction part in a thickness direction of the second conduction part being higher than a thermal conductivity of the second conduction part in directions along the second main surface.

2. The semiconductor device according to claim 1, wherein the second conduction part has a frame shape surrounding a periphery of the first conduction part.

3. The semiconductor device according to claim 1, further comprising:
   a cooling device attached to a bottom surface of the heat dissipation sheet; and
   a bonding layer containing a thermocompression type adhesive agent, inserted at least one of between the circuit substrate of the semiconductor module and the heat dissipation sheet and between the heat dissipation sheet and said cooling device.

4. The semiconductor device according to claim 2, further comprising:
   a cooling device attached to a bottom surface of the heat dissipation sheet; and
   a bonding layer containing a thermocompression type adhesive agent, inserted at least one of between the semiconductor module and the heat dissipation sheet and between the heat dissipation sheet and said cooling device.

5. The semiconductor device according to claim 3,
   wherein the circuit substrate includes an insulating substrate at bottom,
   wherein a main component of the adhesive agent is a resin material,
   wherein the bonding layer containing the thermocompression type adhesive agent is inserted between the circuit substrate of the semiconductor module and the heat dissipation sheet, and
   wherein a resin material of a main component of the insulating substrate is the same as the resin material of the main component of the adhesive agent.

6. The semiconductor device according to claim 4,
   wherein the circuit substrate includes an insulating substrate at bottom,
   wherein a main component of the adhesive agent is a resin material,
   wherein the bonding layer containing the thermocompression type adhesive agent is inserted between the circuit substrate of the semiconductor module and the heat dissipation sheet, and
   wherein a resin material of a main component of the insulating substrate is the same as the resin material of the main component of the adhesive agent.

7. A method of manufacturing a semiconductor device, comprising:

preparing a semiconductor module that includes a circuit substrate and a semiconductor chip on a top surface of the circuit substrate;

preparing a heat dissipation sheet that includes:
- a sheet-shaped first conduction part that has a first main surface, a thermal conductivity of the first conduction part in directions along the first main surface being higher than a thermal conductivity of the first conduction part in a thickness direction of the first conduction part; and
- a sheet-shaped second conduction part that is provided next to the first conduction part at an end of the first conduction part and that has a second main surface continuing from the first main surface, a thermal conductivity of the second conduction part in a thickness direction of the second conduction part being higher than a thermal conductivity of the second conduction part in directions along the second main surface; and bonding the first main surface of the first conductive part to a bottom surface of the circuit substrate of the semiconductor module.

8. The method of manufacturing the semiconductor device according to claim 7, further comprising planarizing a bottom surface of the heat dissipation sheet that has been bonded to the bottom surface of the circuit substrate so as to remove a warp of the bottom surface of the heat dissipation sheet that is caused by warping of the semiconductor module.

\* \* \* \* \*